United States Patent [19]

Okamura et al.

[11] Patent Number: 5,691,229
[45] Date of Patent: Nov. 25, 1997

[54] PROCESS OF FABRICATING DYNAMIC RANDOM ACCESS MEMORY CELL HAVING INTER-LEVEL INSULATING STRUCTURE WITHOUT SILICON NITRIDE LAYER BETWEEN ACCESS TRANSISTOR AND STORAGE NODE

[75] Inventors: Kenji Okamura; Masanobu Zenke, both of Tokyo, Japan

[73] Assignee: NEC Corporation, Tokyo, Japan

[21] Appl. No.: 784,774

[22] Filed: Jan. 16, 1997

[30] Foreign Application Priority Data

Jan. 17, 1996 [JP] Japan .................. 8-005498

[51] Int. Cl.$^6$ ............................ H01L 21/70
[52] U.S. Cl. ............... 437/60; 437/47; 437/52; 437/919; 148/DIG. 14
[58] Field of Search ................. 437/47, 52, 60, 437/919; 148/DIG. 14

[56] References Cited

U.S. PATENT DOCUMENTS

| | | | |
|---|---|---|---|
| 5,273,925 | 12/1993 | Yamanaka | 437/919 |
| 5,387,533 | 2/1995 | Kim | 437/60 |
| 5,491,103 | 2/1996 | Ahn et al. | 437/919 |
| 5,492,849 | 2/1996 | Park | 437/919 |

FOREIGN PATENT DOCUMENTS

| | | |
|---|---|---|
| 3-205861 | 9/1991 | Japan . |
| 5-218333 | 8/1993 | Japan . |
| 6-29463 | 2/1994 | Japan . |

*Primary Examiner*—Tuan H. Nguyen
*Attorney, Agent, or Firm*—Sughrue, Mion, Zinn, Macpeak & Seas, PLLC

[57] ABSTRACT

A cylindrical storage node electrode increases the surface area and, accordingly, the capacitance of a storage capacitor of a dynamic random access memory cell, and a silicon nitride layer is used as an etching stopper which is removed before completion of the storage capacitor so that hydrogen surely cures crystal defects during a hydrogen treatment carried out after patterning metal wirings.

11 Claims, 8 Drawing Sheets

PROCESS OF FABRICATING DYNAMIC RANDOM ACCESS MEMORY CELL HAVING INTER-LEVEL INSULATING STRUCTURE WITHOUT SILICON NITRIDE LAYER BETWEEN ACCESS TRANSISTOR AND STORAGE NODE

FIELD OF THE INVENTION

This invention relates to a process of fabricating a dynamic random access memory cell and, more particularly, to a process of fabricating a storage capacitor incorporated in a dynamic random access memory cell.

DESCRIPTION OF THE RELATED ART

A semiconductor dynamic random access memory device has increased memory cells, and the increase of integration density is achieved by reducing an occupation area assigned to each memory cell. A three-dimensional cell structure drastically reduces the occupation area. A typical example of the three-dimensional cell structure is known as a stacked capacitor cell, which has an access transistor fabricated on the major surface of a semiconductor substrate and a stacked capacitor provided over the access transistor. The stacked capacitor includes a storage node electrode connected to the access transistor, a dielectric film structure formed over the storage node electrode and a cell plate electrode held in contact with the dielectric film structure.

The cell plate electrode was opposed through the dielectric film structure to the upper surface and the side surface of the storage node electrode, and the capacitance was too small to employ the prior art structure of the stacked capacitor for a dynamic random access memory cell of the next generation.

One of the solution is disclosed in Japanese Patent Publication of Unexamined Application (JPA) No. 3-205861. We firstly describe the process sequence disclosed in the Japanese Patent Publication of Unexamined Application with reference to FIGS. 1A to 1C of the drawings.

The prior art process starts with preparation of a silicon substrate 1, and a field oxide layer (not shown) is selectively grown on the major surface of the silicon substrate 1. The field oxide layer defines a plurality of active areas in the major surface, and one of the active areas is shown in FIGS. 1A to 1C.

Silicon oxide is grown to 400 nanometers thick on the active area so as to cover the active area with a silicon oxide layer 3a. On the silicon oxide layer 3a is further grown silicon nitride which forms a silicon nitride layer 3b of 400 nanometers thick.

Subsequently, a photo-resist etching mask (not shown) is provided through a lithographic process, and exposes a part of the silicon nitride layer 3b and a part of the silicon oxide layer 3a over the source region 2 to different kinds of etchant. As a result, a contact hole 3c formed in the silicon oxide layer 3a and the silicon nitride layer 3b, and the source region 2 is exposed to the contact hole 3c.

Doped polysilicon is deposited over the entire surface of the resultant structure. The doped polysilicon fills the contact hole 3c, and swells into a doped polysilicon layer of 600 nanometers thick. Phosphorous is usually introduced into the doped polysilicon. A photo-resist etching mask (not shown) is provided on the doped polysilicon layer, and the doped polysilicon layer is patterned into a storage node electrode 4a. The dopant impurity is diffused from the doped polysilicon into the silicon substrate 1 during the formation of the storage node electrode 4a, and an impurity region 5 is formed in the silicon substrate 1 as shown in FIG. 1A. The impurity region 5 serves as a part of an access transistor.

Subsequently, silicon nitride layer 3b is isotropically etched away by using phosphoric acid solution, and not only the upper and side surfaces of the storage node electrode 4a but also the lower surface of the storage node electrode 4a are exposed. The doped polysilicon is oxidized in a dry ambience at 900 degrees in centigrade, and a silicon oxide layer 4b is grown to 15 nanometers thick on the upper, side and lower surfaces of the storage node electrode 4a as shown in FIG. 1B.

Finally, doped polysilicon is deposited to 600 nanometers thick over the entire surface of the resultant structure shown in FIG. 1B, and forms a cell plate electrode 4c as shown in FIG. 1C. The storage node electrode 4a, the silicon oxide layer 4b and the cell plate electrode 4c as a whole constitute a storage capacitor 4.

The prior art storage capacitor 4 has a surface area 1.2 times wider than that of the conventional storage capacitor by virtue of the lower surface of the storage node electrode 4a, and, accordingly, the capacitance is 1.2 times increased. However, the increment is insufficient to the storage capacitor of the next generation. Moreover, the phosphoric acid for removing the silicon nitride layer 3b penetrates into the silicon substrate 1 so as to deteriorate the silicon substrate 1, and breaks the silicon pole 4d of the storage node electrode 4a, because the phosphoric acid has a small selectivity between the silicon nitride and the phosphorous doped polysilicon. Thus, the prior art process disclosed in the Japanese Patent Publication of Unexamined Application is not available for manufacturing a semiconductor dynamic random access memory cell of the next generation.

Another solution is to use a cylindrical storage node electrode. Not only the outer side surface but also the inner side surface of the cylindrical portion are available for the accumulation of electric charge, and the capacitance is more than twice larger than that of the conventional storage capacitor. A storage capacitor with a cylindrical storage node electrode is hereinbelow referred to as "cylindrical storage capacitor".

A typical example of the process of fabricating the cylindrical storage capacitor is disclosed in Japanese Patent Publication of Unexamined Application No. 6-29463, and FIGS. 2A to 2C illustrates the process sequence disclosed in the Japanese Patent Publication of Unexamined Application.

The process starts with preparation of a silicon substrate 11. A field oxide layer 12 is selectively grown on a major surface of the silicon substrate 11, and defines a plurality of active areas in the major surface of the silicon substrate 11. One of the active areas is assigned to the prior art dynamic random access memory cell.

A thin gate oxide layer 13a is grown on the active area, and a gate electrode 13b is patterned from a conductive layer such as a polysilicon layer or a refractory metal silicide layer. Arsenic or phosphorous is ion implanted into the active area in a self-aligned manner with the gate electrode 13b, and forms a source region 13c and a drain region 13d. The gate oxide layer 13a, the gate electrode 13b, the source region 13c and the drain region 13d form in combination an access transistor 13.

Subsequently, silicon dioxide is deposited over the access transistor 13 and the field oxide layer 12 by using a chemical vapor deposition, and the access transistor 13 is covered with a silicon dioxide layer 14a. Silicon nitride is, thereafter, deposited over the silicon dioxide layer 14a by using a chemical vapor deposition, and the silicon dioxide layer 14a is overlain by a silicon nitride layer 14b.

An appropriate photo-resist etching mask (not shown) is provided on the silicon nitride layer 14b, and exposes a part of the silicon nitride layer 14b and a part of the silicon dioxide layer 14a to etchant. A contact hole 14c is formed in the silicon nitride layer 14b and the silicon dioxide layer 14a, and the source region 13c is exposed to the contact hole 14c.

Polysilicon is deposited over the entire surface of the resultant structure. The polysilicon fills the contact hole 14c, and swells into a polysilicon layer over the silicon nitride layer 14b. Silicon dioxide is deposited over the polysilicon layer, and the polysilicon layer is overlain by a silicon dioxide layer. A photo-resist etching mask 15 is provided over the silicon dioxide layer through a lithographic process, and the silicon dioxide layer and the polysilicon layer are partially uncovered with the photo-resist etching mask 15. The silicon dioxide layer and the polysilicon layer uncovered with the photo-resist etching mask are successively etched away, and a column portion 16a of a storage node electrode 16b is left on the silicon nitride layer 14b. A silicon dioxide strip 16c is laminated on the column portion 16a as shown in FIG. 2A.

The photo-resist etching mask 15 is stripped off, and polysilicon is deposited over the entire surface of the resultant structure. A polysilicon layer topographically extends over the silicon nitride layer 14b, the column portion 16a and the silicon dioxide strip 16c. The polysilicon layer is formed into a side wall 16d by using an etch-back, and the side surface of the column portion 16a and the side surface of the silicon dioxide strip 16c are covered with the side wall 16d as shown in FIG. 2B. The polysilicon side wall 16d serves as a cylindrical portion.

Using the silicon nitride layer 14b as an etching stopper, the silicon dioxide strip 16c is etched away, and the cylindrical portion 16d projects over the column portion 16a. Arsenic is introduced into the column portion 16a and the cylindrical portion 16d, and the storage node electrode 16b is obtained.

The exposed surface of the storage node electrode 16b is covered with a dielectric layer 16e of silicon nitride, and the dielectric layer 16e is covered with a polysilicon cell plate electrode 16f as shown in FIG. 2C. The storage node electrode 16b, the dielectric layer 16e and the cell plate electrode 16f as a whole constitute a cylindrical storage capacitor 16. The cylindrical portion 16d drastically increases the surface area of the storage node electrode 16b and, accordingly, the capacitance of the cylindrical storage capacitor 16.

Thus, the manufacturer requires the silicon oxide strip 16c so as to form the polysilicon layer into the side wall or the cylindrical portion 16d, and the silicon nitride layer 14b allows the manufacturer to remove the silicon oxide strip 16c without a damage of the inter-level insulating layer 14a.

The cylindrical storage capacitor can be fabricated through another process shown in FIGS. 3A to 3D. The prior art process shown in FIGS. 3A to 3D is disclosed in Japanese Patent Publication of Unexamined Application No. 5-218333, and proceeds as follows.

First, a field oxide 21a is selectively grown on the major surface of a silicon substrate 20, and an access transistor 21 is fabricated on an active area as similar to the access transistor 13. The access transistor 21 includes a gate oxide layer 21a, a gate electrode 21b, a source region 21c and a drain region 21d.

Subsequently, a lower inter-level insulating layer 22a is formed over the access transistor 21, and is overlain by a smoothening layer 22b. The smoothening layer 22b provides a flat surface. Silicon nitride is deposited over the entire surface of the smoothening layer 22b, and forms a silicon nitride layer 22c. The silicon nitride layer 22c serves as an etching stopper. Silicon oxide is deposited over the silicon nitride layer 22c, and the silicon nitride layer 22c is overlain by a silicon oxide layer 22d.

A photo-resist etching mask (not shown) is provided on the silicon oxide layer 22d, and the silicon oxide layer 22d, the silicon nitride layer 22c, the smoothening layer 22b and the lower inter-level insulating layer 22a are partially etched away so as to form a contact hole. The source region 21c is exposed to the contact hole. Silicon nitride and silicon oxide are successively deposited to the entire surface of the resultant structure, and are anisotropically etched away until the silicon oxide layer 22d is exposed again. The remaining silicon nitride layer and the remaining silicon oxide layer form a spacer 12e on the inner surface defining the contact hole. Thus, the inter-level insulating layer 22a, the smoothening layer 22b and the access transistor 21 are wrapped in the silicon nitride layer 22c and the silicon nitride layer of the spacer 22e.

Subsequently, polysilicon is deposited over the entire surface of the resultant structure. The polysilicon fills the contact hole, and swells into a polysilicon layer. An appropriate photo-resist etching mask 23a is provided on the polysilicon layer through a lithographic process. Silicon dioxide is deposited over the entire surface of the structure, and the photo-resist etching mask 23a and the polysilicon layer are covered with a silicon dioxide layer. The silicon dioxide layer is anisotropically etched so as to form a side wall spacer 23b on the side wall of the photo-resist etching mask 23a. Using the photo-resist etching mask 23a and the wide wall spacer 23b, the polysilicon layer is etched until the silicon oxide layer 22d is exposed again, and the polysilicon layer is patterned into a polysilicon column 24a as shown in FIG. 3A.

The photo-resist etching mask 23a is removed from the resultant structure shown in FIG. 3A, and the polysilicon column 24a is etched by using the side wall spacer 23b as an etching mask, and a recess 24b is formed in the polysilicon column 24a. The remaining polysilicon forms a cylindrical portion 24c projecting from the outer periphery of a column portion 24d, and the cylindrical portion 24c and the column portion 24d form in combination a storage node electrode 24e as shown in FIG. 3B.

Subsequently, the side wall spacer 23b and the silicon oxide layer 22d are etched away, and the lower surface of the storage node electrode is exposed as shown in FIG. 3C. The silicon nitride layer 22c and the silicon nitride layer of the spacer 22e prevent the access transistor 21 from the etchant during the etching.

Subsequently, dielectric layer 24f is topographically formed over the storage node electrode 24e, and doped polysilicon is deposited over the dielectric layer 24e. The doped polysilicon forms a cell plate electrode 24g, and the storage node electrode 24e, the dielectric layer 24e and the cell plate electrode 24g constitute a cylindrical storage capacitor 24.

The cylindrical portion 24c increases the surface area of the storage node electrode 24e and, accordingly, the capacitance of the cylindrical storage capacitor 24.

However, a problem is encountered in the prior art dynamic random access memory cells fabricated through the prior art processes in poor data holding characteristics. In other words, the electric charge tends to be leaked from the storage node electrodes within a short time period, and the cylindrical storage capacitors lose the data bits.

SUMMARY OF THE INVENTION

It is therefore an important object of the present invention to provide a process of fabricating a semiconductor memory cell which improves the data holding characteristics of a cylindrical storage capacitor.

The present inventors contemplate the problem inherent in the prior art processes, and noticed that the silicon nitride layers 14b and 22c were left between the access transistors 13/21 and the storage node electrodes 16b and 24e.

When metal wirings were patterned on inter-level insulating layers (not shown) over the cylindrical storage capacitors 16 and 24, the resultant structure were subjected to a hydrogen treatment called as "hydrogen forming" at 400 degrees in centigrade for 30 minutes, and crystal defects were cured through the hydrogen treatment. However, the silicon nitride layers 14b and 22c did not allow the hydrogen to penetrate into the lower inter-level insulating layers 14a and 22a/22b. The present inventor concluded that a large amount of crystal defects were left in the silicon substrates 11/20. The large amount of crystal defect caused the accumulated electric charge to flow out from the storage node electrodes 16b/24b within a short time.

To accomplish the object, the present invention proposes to remove all silicon nitride layers from between an access transistor and a storage node electrode before the hydrogen treatment.

In accordance with the present invention, there is provided a process of fabricating a semiconductor memory cell, comprising the steps of: a) fabricating an access transistor on a semiconductor substrate; b) covering the access transistor with a first insulating layer of a first insulating material; c) covering the first insulating layer with a second insulating layer of silicon nitride; d) forming a contact hole in the first and second insulating layers so as to expose an impurity region of the access transistor thereto; e) forming a column portion of a conductive material on the second insulating layer held in contact through the contact hole to the impurity region and covered with a third insulating layer of a second insulating material; f) forming a cylindrical portion of the conductive material held in contact with a side surface of the column portion by using a first etchant having a selectivity between the second insulating material/said silicon nitride and the conductive material; g) etching the second and third insulating layers by using a second etchant having a selectivity between the first insulating material/the conductive material and the second insulating material/said silicon nitride for exposing a top surface of the column portion and a lower surface of the column portion; h) covering exposed surfaces of the column portion and exposed surfaces of the cylindrical portion with a dielectric film structure; i) covering the dielectric film structure with a cell plate electrode for completing a storage capacitor; and j) treating the semiconductor memory cell having the access transistor and the storage capacitor with hydrogen for curing crystal defects.

BRIEF DESCRIPTION OF THE DRAWINGS

The features and advantages of the process according to the present invention will be more clearly understood from the following description taken in conjunction with the accompanying drawings in which.

DESCRIPTION OF THE PREFERRED EMBODIMENT

Figure 1A:
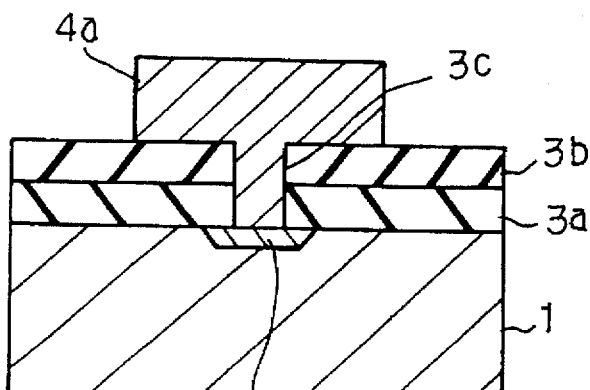
FIGS. 1A to 1C are cross sectional views showing the prior art process disclosed in Japanese patent Publication of Unexamined Application No. 3-205861.
Figure 1B:
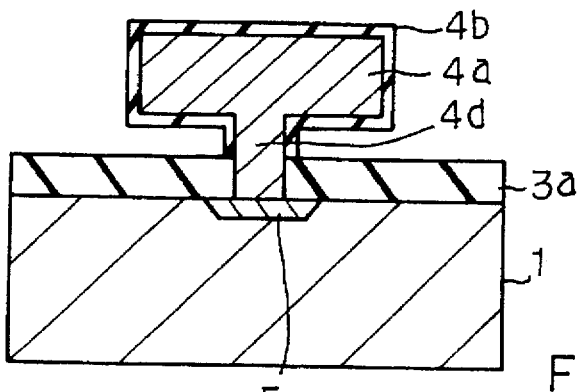
Figure 1C:
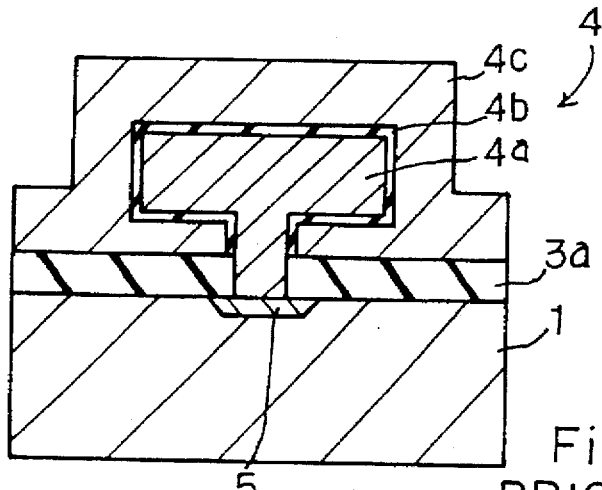
Figure 2A:
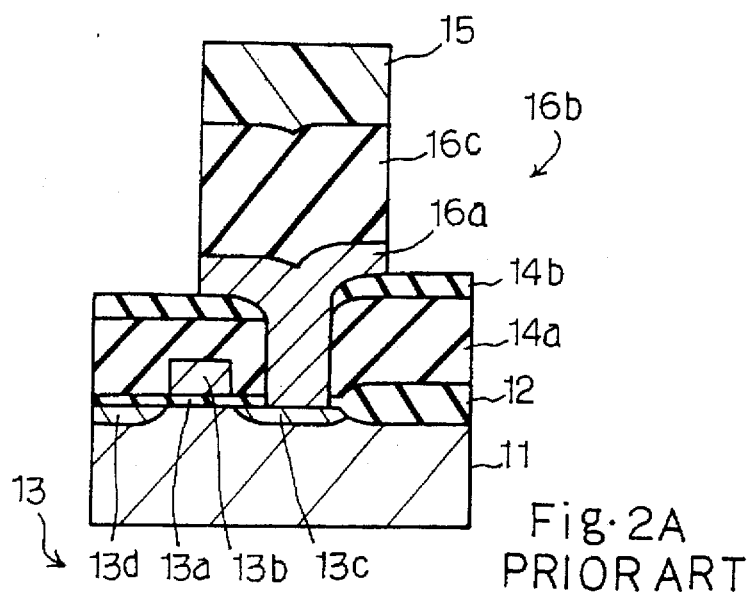
FIGS. 2A to 2C are cross sectional view showing the prior art process disclosed in Japanese Patent Publication of Unexamined Application No. 6-29463.
Figure 2B:
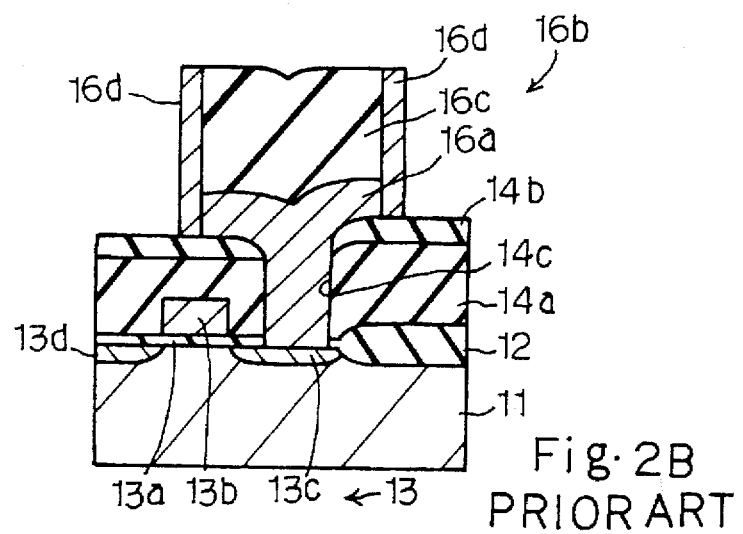
Figure 2C:
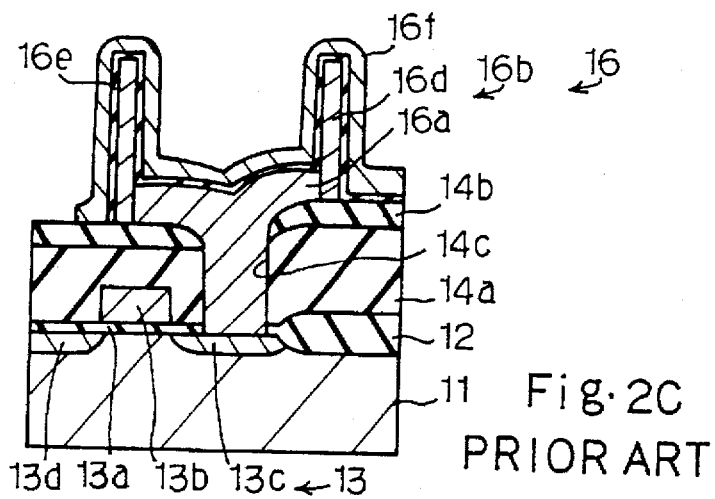
Figure 3A:
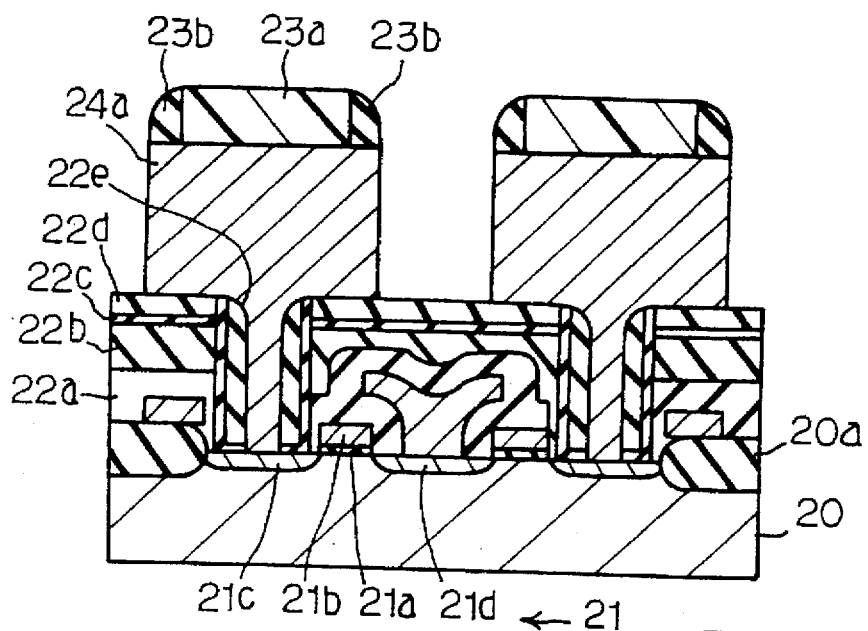
FIGS. 3A to 3D are cross sectional views showing the prior art process disclosed in Japanese Patent Publication of Unexamined Application No. 5-218333.
Figure 3B:
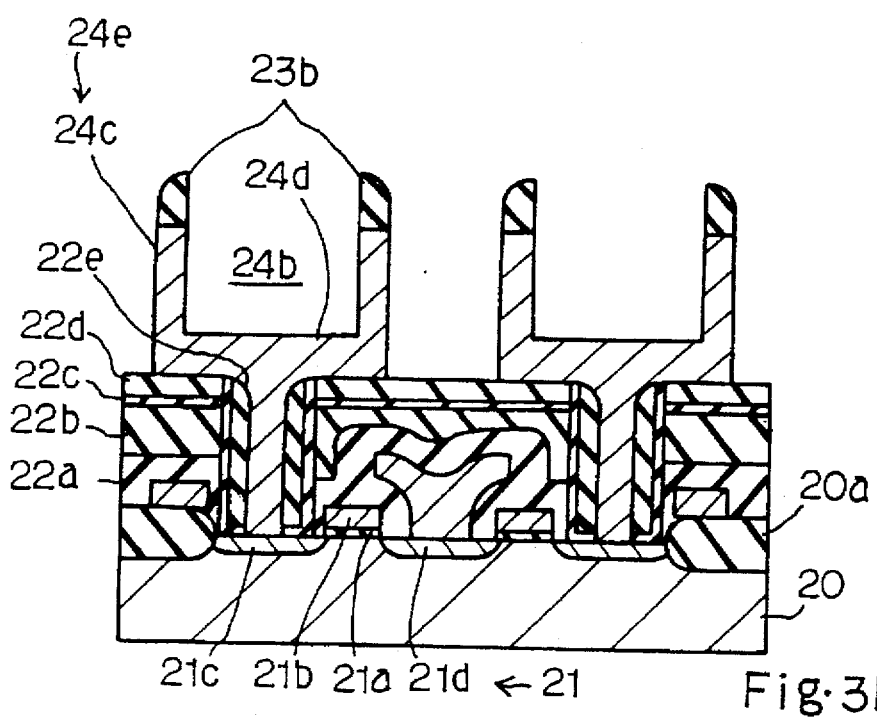
Figure 3C:
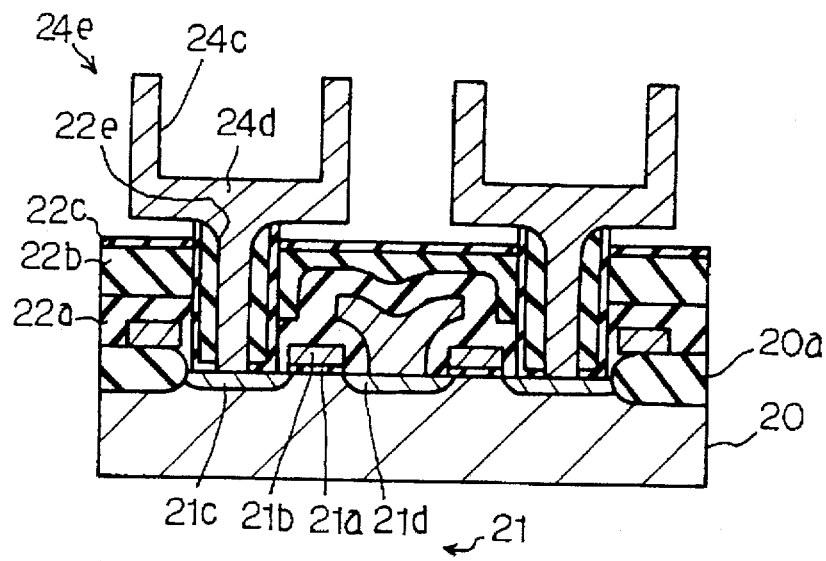
Figure 3D:
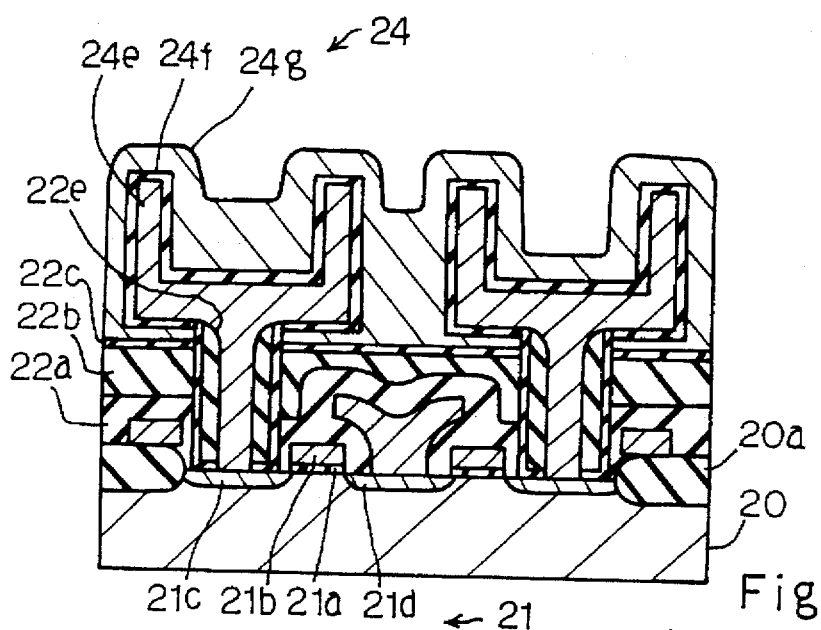

FIGS. 4A to 4H illustrate a process of fabricating a dynamic random access memory cell embodying the present invention. The process starts with preparation of a silicon substrate 30a. A thick field oxide layer 30b is selectively grown to 450 nanometers thick on a major surface of the silicon substrate 30a, and defines an active area in the major surface. A dynamic random access memory cell is assigned the active area, and an access transistor 31 and a cylindrical storage capacitor 32 constitute the dynamic random access memory cell.

The active area is thermally oxidized so as to grow a thin gate insulating layer 31a, and polysilicon is deposited to 150 nanometers thick over the thin gate insulating layer 31a and the thick field oxide layer 30b. A polysilicon layer is laminated on the thick field oxide layer 30b and the thin gate insulating layer 31a.

Photo-resist solution is spun onto the polysilicon layer, and is baked so as to cover the polysilicon layer with a photo-resist layer. A pattern image for a gate electrode is optically transferred from a photo-mask (not shown) to the photo-resist layer, and a latent image is formed in the photo-resist layer. The latent image is developed, and a photo-resist etching mask (not shown) is formed from the photo-resist layer. The process described hereinbefore is simply referred to as "lithographic process". Using the photo-resist etching mask, the polysilicon is selectively etched away, and a gate electrode 31b is formed on the gate insulating layer 31a.

Figure 4A:
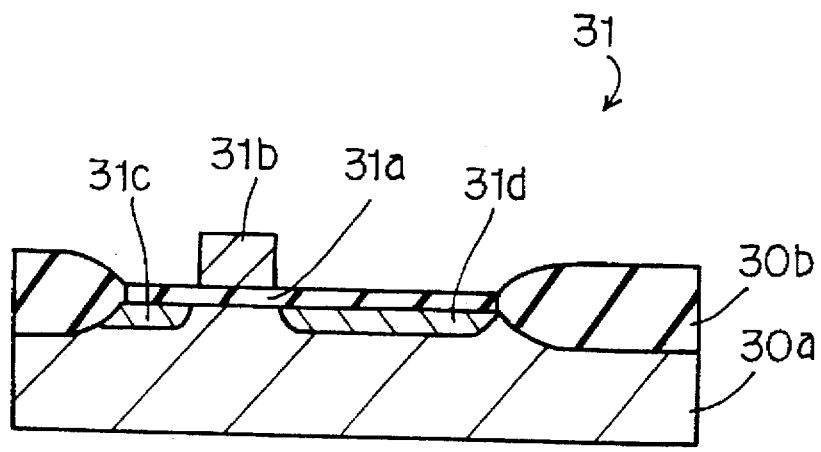
FIGS. 4A to 4H are cross sectional views showing a process of fabricating a semiconductor memory cell according to the present invention.

Dopant impurity such as arsenic is ion implanted into the active area in a self-aligned manner with the gate electrode 31b, and forms a source region 31c and a drain region 31d as shown in FIG. 4A. The thin gate insulating layer 31a, the gate electrode 31b, the source region 31c and the drain region 31d as a whole constitute the access transistor 31.

Subsequently, boro-phospho-silicate glass is deposited to 600 nanometers thick over the entire surface of the structure by using a chemical vapor deposition, and the access transistor 31 is covered with a boro-phospho-silicate glass layer 33a. Thereafter, the boro-phospho-silicate glass layer 33a is reflowed at 850 degrees in centigrade so as to create a smooth top surface. The deposition of boro-phospho-silicate glass and the reflow may be repeated several times for forming the boro-phospho-silicate glass layer 33a.

Silicon oxide is deposited to 200 nanometers thick over the entire surface of the boro-phospho-silicate glass layer 33a by using a chemical vapor deposition, and the boro-phospho-silicate glass layer 33a is overlain by a silicon oxide layer 33b. The boro-phospho-silicate glass layer 33a and the silicon oxide layer 33b form in combination a lower inter-level insulating structure 33.

Subsequently, silicon nitride is deposited to 100 nanometers thick over the entire surface of the silicon oxide layer 33b by using a chemical vapor deposition, and the silicon oxide layer 33b is overlain by a silicon nitride layer 33c.

Figure 4B:
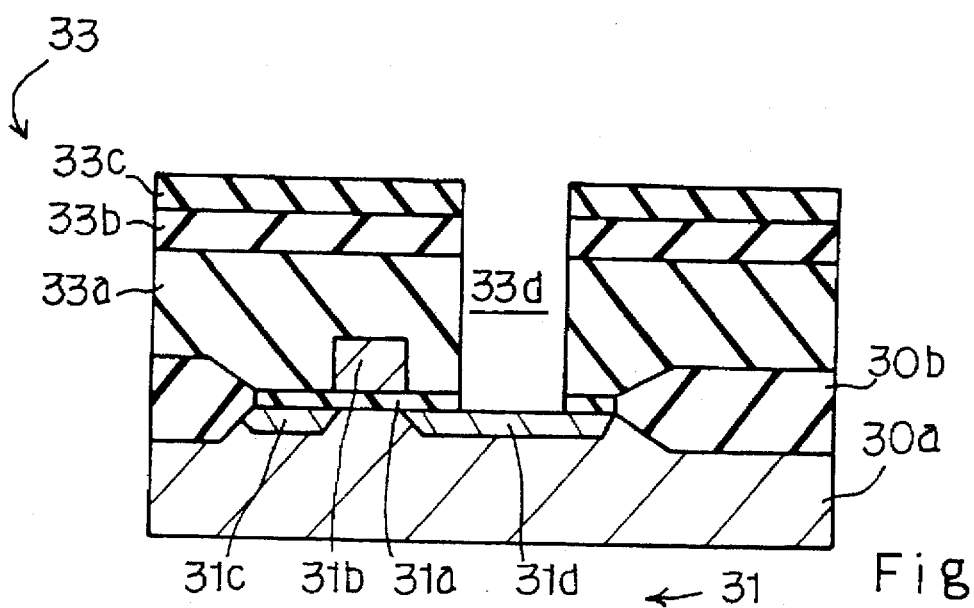

A photo-resist mask (not shown) is provided on the silicon nitride layer 33c through the lithographic process, and has a hollow space over the source region 31d. Using the photo-resist mask, the silicon nitride layer 33c, the silicon oxide layer 33b and the boro-phospho-silicate glass layer 33a are selectively etched by using dry etching techniques, and a contact hole 33d is formed as shown in FIG. 4B. The contact hole 33d is 500 nanometers in diameter, and the source region 31d is exposed to the contact hole 33d.

Subsequently, silicon oxide is deposited over the entire surface of the resultant structure by using a chemical vapor deposition. The silicon oxide fills the contact hole 33d, and swells into a silicon oxide layer of 150 nanometers thick. The silicon oxide layer topographically extends, and the inner surface of the contact hole 33d is covered with the silicon oxide layer. The silicon oxide layer is formed into a side wall 33e by using an etch-back technique, and the side wall 33e defines a secondary contact hole. The source region 31d is still exposed to the secondary contact hole.

Subsequently, polysilicon is deposited over the entire surface of the resultant structure by using a chemical vapor deposition. The polysilicon fills the secondary contact hole, and swells into a polysilicon layer of 250 nanometers thick. Boro-phospho-silicate glass is deposited to 500 nanometers thick over the entire surface of the polysilicon layer, and the polysilicon layer is overlain by a boro-phospho-silicate glass layer. The boro-phospho-silicate glass layer is treated with heat at 850 degrees in centigrade.

Figure 4C:
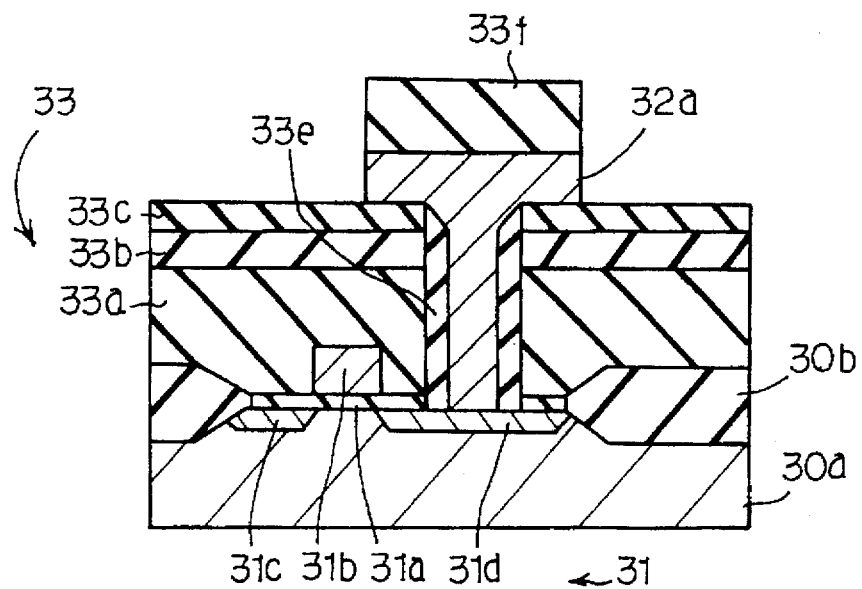

A photo-resist etching mask (not shown) is provided on the boro-phospho-silicate glass layer through the lithographic process, and the boro-phospho-silicate glass layer and the polysilicon layer are patterned into a column portion 32a overlain by a boro-phospho-silicate glass strip 33f by using the photo-resist etching mask as shown in FIG. 4C.

Figure 4D:
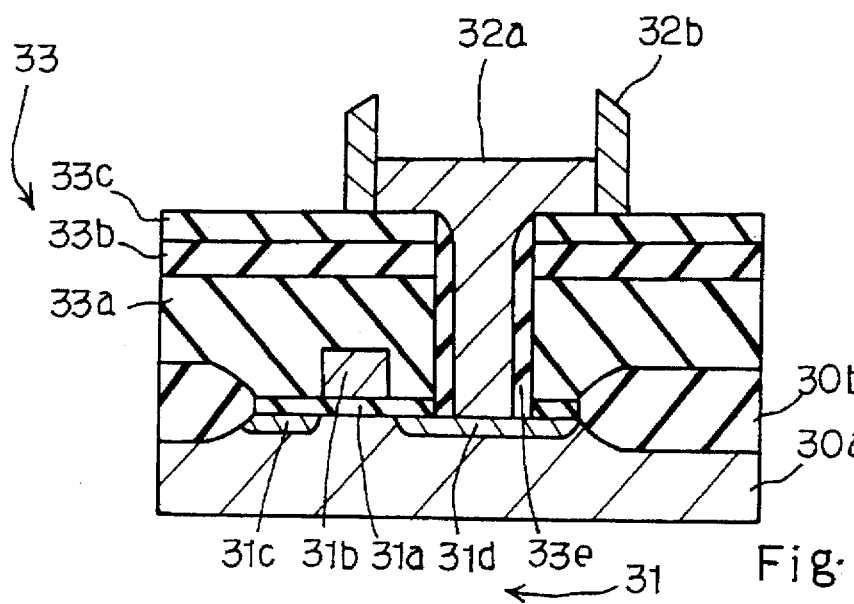

Subsequently, polysilicon is deposited to 150 nanometers thick over the entire surface of the resultant structure, and a polysilicon layer topographically extends over the exposed upper surface of the silicon nitride layer 33c, the side surface of the column portion 32a and the side and upper surfaces of the boro-phospho-silicate glass strip 33f. The polysilicon layer is formed into a cylindrical portion 32b by using an anisotropical etching technique. While the polysilicon layer is being etched, the boro-phospho-silicate glass strip 33f prevents the column portion 32a from the etchant, and the silicon nitride layer 33c does not allow the etchant to penetrate into the silicon oxide layer 33b and the boro-phospho-silicate glass layer 33a. After the formation of the cylindrical portion 32b, the boro-phospho-silicate glass strip 33f is exposed to buffered hydrofluoric acid where HF and NH$_4$F are regulated to 1:30. The buffered hydrofluoric acid etches the boro-phospho-silicate glass strip 33f; however, the buffered hydrofluoric acid does not damage the cylindrical portion 32b of polysilicon. As a result, the polysilicon layer is formed into a cylindrical portion 32b, and the cylindrical portion 32b projects over the column portion 32a as shown in FIG. 4D. While the buffered hydrofluoric acid is etching the boro-phospho-silicate glass strip 33f, the silicon nitride layer 33c prevents the silicon oxide layer 33b and the boro-phospho-silicate glass layer 33a from the etchant.

Subsequently, the silicon nitride layer 33c is etched away by using phosphoric acid solution at 160 degrees in centigrade, and a gap takes place between the lower surface of the column portion 32a and the silicon oxide layer 33b. While the phosphoric acid solution is etching the silicon nitride layer 33c, the silicon oxide layer 33b and the side wall 33e of silicon oxide do not allow the etchant to penetrate into the boro-phospho-silicate glass layer 33a.

Figure 4E:
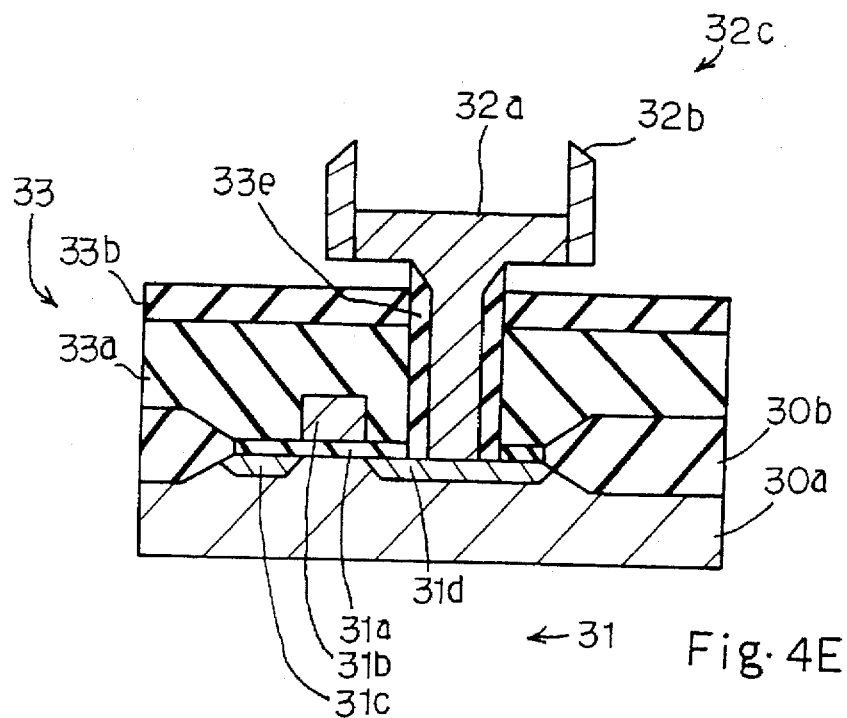

Phosphorous is diffused into the cylindrical portion 32b and the column portion 32a at 820 degrees in centigrade, and the dopant concentration is regulated to $1 \times 10^{20}$ cm$^{-3}$. The column portion 32a and the cylindrical portion 32b form in combination a storage node electrode 32c as shown in FIG. 4E.

Subsequently, the entire surface of the storage node electrode 32c is covered with a dielectric film structure 32d. In this instance, a silicon nitride film of 7 nanometers thick and a silicon oxide film of 1 to 2 nanometers thick form in combination the dielectric film structure 32d. The silicon oxide film may be formed through a thermal oxidation of silicon nitride film.

Figure 4F:
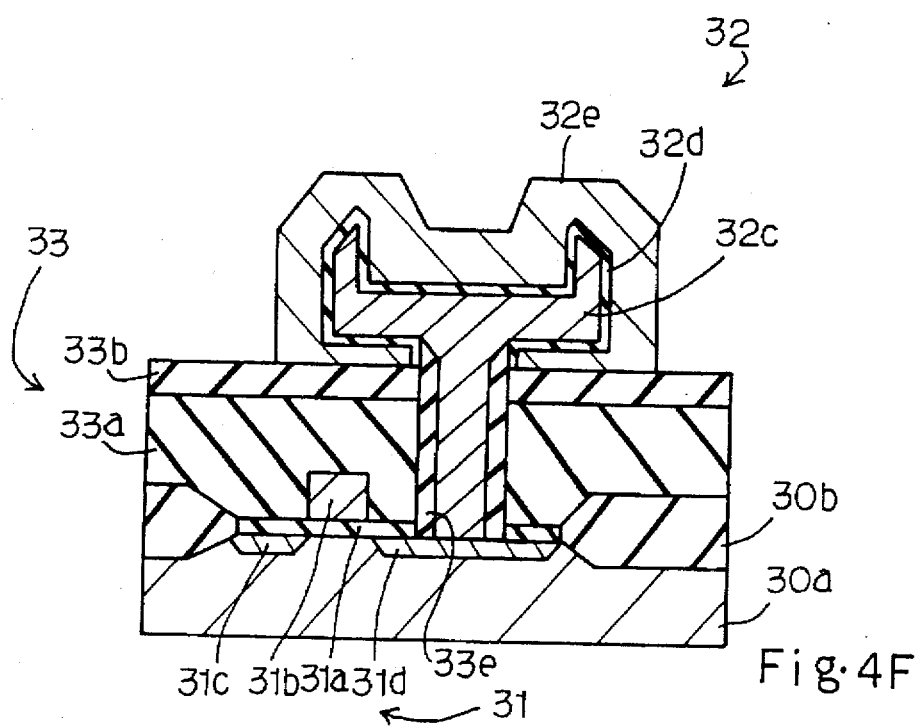

Thereafter, doped polysilicon is deposited to 200 nanometers thick over the entire surface of the resultant structure, and the doped polysilicon layer is patterned into a cell plate electrode 32e as shown in FIG. 4F. The storage node electrode 32c, the dielectric film structure 32d and the cell plate electrode 32e as a whole constitute the cylindrical storage capacitor 32.

Figure 4G:
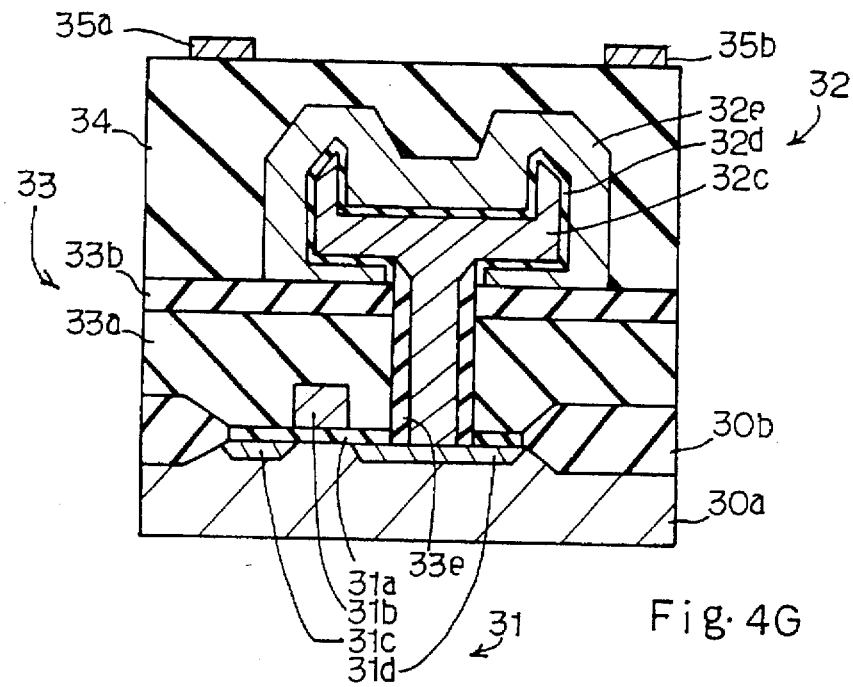

An insulating material such as, for example, silicon oxide is deposited over the entire surface of the resultant structure, and the cylindrical storage capacitor 32 is covered with an upper inter-level insulating layer 34. Aluminum is deposited over the entire surface of the upper inter-level insulating layer 34, and the aluminum layer is patterned into metal wirings 35a and 35b as shown in FIG. 4G.

Figure 4H:
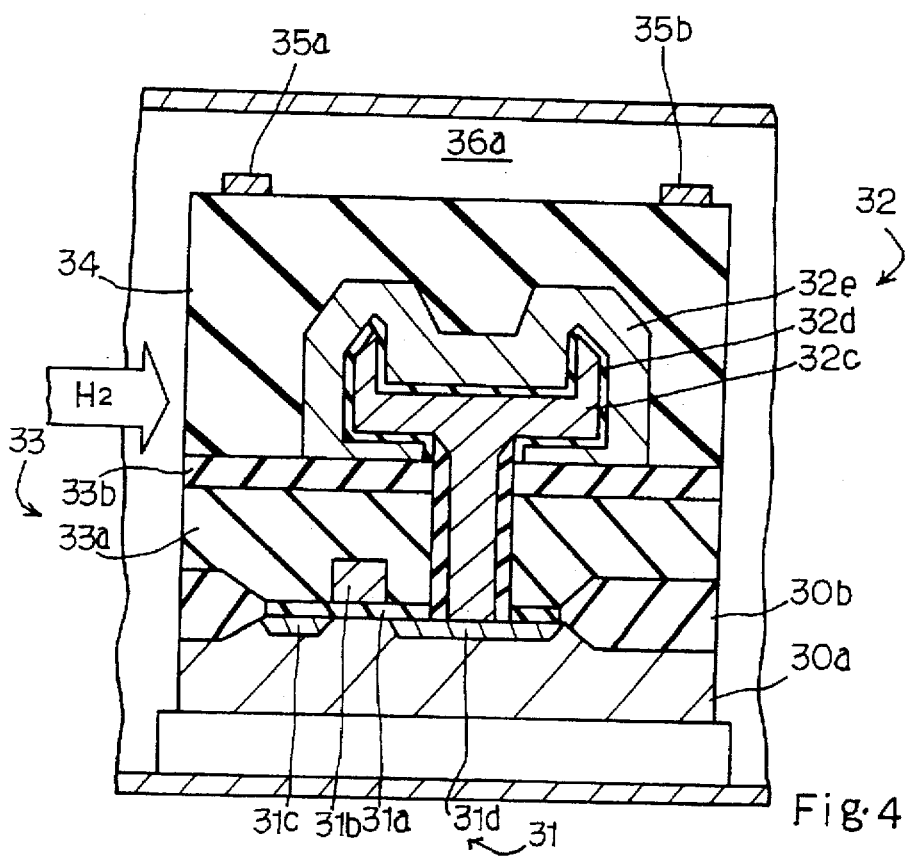

After the formation of the metal wirings 35a and 35b, the resultant structure is placed in a chamber 36a, and hydrogen is introduced into the chamber 36a. The resultant structure shown in FIG. 4G is treated with the hydrogen at 450 degrees in centigrade for 30 minutes as shown in FIG. 4H. The hydrogen penetrates through the upper inter-level insulating layer 34 and the lower inter-level insulating layer 33, and cures crystal defects. No silicon nitride layer is left in the upper and lower inter-level insulating structures 33 and 34, and the hydrogen easily reaches the silicon substrate 30a.

As will be understood from the foregoing description, the inter-level insulating structures 33 and 34 are formed without a silicon nitride layer, and the hydrogen surely cures the crystal defects during the hydrogen forming, because the hydrogen easily penetrates the silicon oxide and the boro-phospho-silicate glass. As a result, the leakage current is drastically reduced, and the data holding characteristics are improved. Moreover, while the phosphoric acid solution is etching the silicon nitride layer 33c, the silicon oxide layer 33b and the side wall 33e prevents the polysilicon in the contact hole from the etchant, and the column portion 32c is never damaged. Moreover, the surface area of the storage node electrode 32c is increased by removing the silicon nitride layer 33c, and the electric charge accumulated in the cylindrical storage capacitor 32 is large enough to use it for a dynamic random access memory device of the next generation.

Although a particular embodiment of the present invention has been shown and described, it will be obvious to those skilled in the art that various changes and modifications may be made without departing from the spirit and scope of the present invention.

For example, the lower inter-level insulating structure 33 may be implemented by a silicon oxide layer smoothened through a chemical mechanical polishing. The etch-back may be carried out on an area defined by a photo-resist mask for creating a smooth surface.

The present invention is never limited to the thicknesses described hereinbefore.

In the above embodiment, the boro-phospho-silicate glass layer 33f and the silicon nitride layer 33c are successively removed. However, if phosphoric acid solution at 160 degrees in centigrade is applied to the boro-phospho-silicate glass layer 33f and the silicon nitride layer 33c, the phosphoric acid solution simultaneously etches the boro-phospho-silicate glass strip 33f and the silicon nitride layer 33c. Although the side wall 33e is also etched in the phosphoric acid solution at 160 degrees in centigrade, the phosphoric acid solution etches the boro-phospho-silicate glass at twenty times faster than the silicon oxide, and the phosphoric acid solution can not remove the side wall 33e.

Finally, the storage node electrode 32c may be formed of amorphous silicon, refractory metal such as tungsten or molybdenum or ruthenium oxide.

What is claimed is:

1. A process of fabricating a semiconductor memory cell, comprising the steps of:
   a) fabricating an access transistor on a semiconductor substrate;
   b) covering said access transistor with a first insulating layer of a first insulating material;
   c) covering said first insulating layer with a second insulating layer of silicon nitride;
   d) forming a contact hole in said first and second insulating layers so as to expose an impurity region of said access transistor thereto;
   e) forming a column portion of a conductive material on said second insulating layer held in contact through said contact hole to said impurity region and covered with a third insulating layer of a second insulating material;
   f) forming a cylindrical portion of said conductive material held in contact with a side surface of said column portion by using a first etchant having a selectivity between said silicon nitride/said second insulating material and said conductive material;
   g) etching said second and third insulating layers by using a second etchant having a selectivity between said first insulating material/said conductive material and said second insulating material/silicon nitride for exposing a top surface of said column portion and a lower surface of said column portion;
   h) covering exposed surfaces of said column portion and exposed surfaces of said cylindrical portion with a dielectric film structure;
   i) covering said dielectric film structure with a cell plate electrode for completing a storage capacitor; and
   j) treating said semiconductor memory cell having said access transistor and said storage capacitor with hydrogen for curing crystal defects.

2. The process as set forth in claim 1, in which said step b) includes the sub-steps of
   b-1) depositing a first insulating sub-material of said first insulating material over said access transistor for forming a lower insulating sub-layer of said first insulating layer,
   b-2) treating said first insulating sub-material with heat for smoothening a top surface of said lower insulating sub-layer, and
   b-3) depositing a second insulating sub-material of said first insulating material over said top surface of said lower insulating sub-layer for forming an upper insulating layer of said first insulating layer.

3. The process as set forth in claim 2, in which said sub-steps b-1) and b-2) are repeated before said sub-step b-3).

4. The process as set forth in claim 2, in which said first insulating sub-material and said second insulating sub-material are boro-phospho-silicate glass and silicon oxide, respectively.

5. The process as set forth in claim 1, in which said step f) includes the sub-steps of
   f-1) covering an exposed surface of said second insulating layer, a side surface of said column portion and an exposed surface of said third insulating layer with a conductive layer of said conductive material, and
   f-2) anisotropically etching said conductive layer so as to form said cylindrical portion held in contact with said side surface of said column portion and said side surface of said third insulating layer.

6. The process as set forth in claim 1, in which said step g) includes the sub-steps of
   g-1) removing said third insulating layer by using a first sub-etchant of said second etchant having a selectivity between said silicon nitride/said conductive material and said second insulating material, and
   g-2) removing said second insulating layer by using a second sub-etchant of said second etchant having a selectivity between said first insulating material/said conductive material and said silicon nitride.

7. The process as set forth in claim 1, in which said second and third insulating layers are simultaneously removed.

8. The process as set forth in claim 6 or 7, in which said first insulating material, said second insulating material and said conductive material are silicon oxide, boro-phospho-silicate glass and polysilicon, respectively.

9. The process as set forth in claim 1, further comprising the steps of forming a side wall of a third insulating material on an inner surface defining said contact hole between said step d) and said step e), and said second etchant has a small etching rate to said third insulating material with respect to said silicon nitride.

10. The process as set forth in claim 9, in which said first insulating material, said second insulating material, said third insulating material and said conductive material are silicon oxide, boro-phospho-silicate glass, silicon oxide and polysilicon, respectively.

11. The process as set forth in claim 9, further comprising the step of forming wirings over said storage capacitor between said step i) and said step j).

* * * * *